(12) United States Patent
Mirgorodski et al.

(10) Patent No.: US 10,067,201 B2
(45) Date of Patent: Sep. 4, 2018

(54) WIRING LAYOUT TO REDUCE MAGNETIC FIELD

(71) Applicant: Texas Instruments Incorporated, Dallas, TX (US)

(72) Inventors: Iouri N Mirgorodski, Sunnyvale, CA (US); Roozbeh Parsa, Portola Valley, CA (US); William French, San Jose, CA (US); Dok Won Lee, Mountain View, CA (US); Ann Gabrys, Woodside, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 328 days.

(21) Appl. No.: 15/099,561

(22) Filed: Apr. 14, 2016

(65) Prior Publication Data
US 2017/0299661 A1 Oct. 19, 2017

(51) Int. Cl.
*G01R 33/09* (2006.01)
*G01R 33/00* (2006.01)
*H05K 1/02* (2006.01)
*H05K 3/06* (2006.01)

(52) U.S. Cl.
CPC ..... *G01R 33/0005* (2013.01); *G01R 33/0052* (2013.01); *H05K 1/0296* (2013.01); *H05K 3/064* (2013.01)

(58) Field of Classification Search
CPC .... G01R 33/09; G01R 33/093; G01R 33/096; G01R 33/098; G01R 31/311; G01R 33/0011; G01R 33/0052; G01R 33/07; G01R 19/0092; G01R 33/04

USPC ....... 324/301, 331, 345, 381, 463, 210–219, 324/228–232, 246–263, 529, 324/750.12–750.21, 754.17–754.29, 167, 324/173, 179; 73/313, 61.41, 779, 73/861.71, 861.78, 862.331; 438/3, 15, 438/17, 18, 11, 127, 14, 613; 428/673, 428/675, 676, 678, 811.2, 900, 216, 611, 428/652, 653
See application file for complete search history.

(56) References Cited

U.S. PATENT DOCUMENTS

| | | | | |
|---|---|---|---|---|
| 6,960,911 | B2* | 11/2005 | Inoue | G01L 9/16 324/207.11 |
| 2002/0036497 | A1* | 3/2002 | Inage | B82Y 10/00 324/252 |
| 2010/0089584 | A1* | 4/2010 | Burns | E21B 43/2401 166/302 |
| 2010/0213933 | A1* | 8/2010 | Mather | G01R 33/098 324/252 |

(Continued)

*Primary Examiner* — Jermele M Hollington
*Assistant Examiner* — Taqi Nasir
(74) *Attorney, Agent, or Firm* — Andrew R. Ralston; Charles A. Brill; Frank D. Cimino (57) ABSTRACT

A magnetic sensor has a circuit segment with a quadrupole region. The quadrupole region includes a supply line, a first return line and a second return line, all in a conductor layer. The first supply line is laterally adjacent to the supply line on a first side, and the second return line is laterally adjacent to the supply line on a second, opposite side. A space between the supply line and the first return line is free of the conductor layer; similarly, a space between the supply line and the second return line is free of the conductor layer. The first return line and the second return line are electrically coupled to the supply line at a terminus of the circuit segment.

20 Claims, 10 Drawing Sheets

(56) References Cited

U.S. PATENT DOCUMENTS

| | | | | |
|---|---|---|---|---|
| 2013/0127455 A1* | 5/2013 | Ettelt | ............... | G01R 33/093 324/252 |
| 2013/0141091 A1* | 6/2013 | Delaet | ............... | G01R 33/093 324/252 |
| 2014/0062472 A1* | 3/2014 | Nishikawa | ............ | G01R 33/098 324/252 |
| 2014/0218019 A1* | 8/2014 | Ausserlechner | ....... | G01R 15/20 324/251 |
| 2015/0097560 A1* | 4/2015 | Kawakami | ............. | G01R 33/09 324/252 |
| 2015/0198679 A1* | 7/2015 | Ausserlechner | ..... | G01R 33/072 324/252 |
| 2015/0362565 A1* | 12/2015 | Sanfilippo | .............. | G01D 5/145 324/251 |
| 2015/0369882 A1* | 12/2015 | Mochizuki | ............ | H01F 7/0278 324/252 |

\* cited by examiner

WIRING LAYOUT TO REDUCE MAGNETIC FIELD

FIELD OF THE INVENTION

This invention relates to the field of magnetic sensors. More particularly, this invention relates to wiring layouts in magnetic sensors.

BACKGROUND OF THE INVENTION

Magnetic sensors using alkali metal vapor cells and/or laser light sources commonly have heater circuits to maintain the cells and lasers at desired temperatures. Heating elements of the heater circuits are frequently formed in a conductor layer to reduce fabrication costs of the magnetic sensors. Currents through the heater elements generate magnetic fields which interfere with operation of the magnetic sensors. Layouts with current supply lines adjacent to current return lines reduce the interfering magnetic fields to some extent, but still limit the sensitivities of the magnetic sensors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A magnetic sensor has a circuit which includes a circuit segment having a quadrupole region. The circuit segment includes a supply line in a conductor layer, a first return line in the conductor layer, and a second return line in the conductor layer. In the quadrupole region, the first return line is laterally adjacent to the supply line on a first side of the supply line, and the second return line is laterally adjacent to the supply line on a second side of the supply line, opposite from the first side. A space between the supply line and the first return line is free of the conductor layer in the quadrupole region; similarly, a space between the supply line and the second return line is free of the conductor layer in the quadrupole region. The first return line is electrically coupled to the supply line at a terminus of the circuit segment, and the second return line is electrically coupled to the supply line at the terminus.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A magnetic sensor has a circuit which includes a circuit segment having a connection end, a quadrupole region, and a terminus at an opposite end from the connection end. The circuit segment includes a supply line in a conductor layer, a first return line in the conductor layer, and a second return line in the conductor layer. In the quadrupole region, the first return line is laterally adjacent to the supply line on a first side of the supply line, and the second return line is laterally adjacent to the supply line on a second side of the supply line, opposite from the first side. A space between the supply line and the first return line is free of the conductor layer in the quadrupole region; similarly, a space between the supply line and the second return line is free of the conductor layer in the quadrupole region. The first return line is electrically coupled to the supply line at the terminus of the circuit segment, and the second return line is electrically coupled to the supply line at the terminus. Electrical connections to the supply line, the first return line and the second return line may be made to connection structures at the connection end. The circuit segment may be arranged in any of various configurations, for example a linear configuration, a serpentine configuration, and a split serpentine configuration. The first return line and the second return line may be connected to the supply line in the conductor layer at the terminus, or out of the conductor layer. The configuration of the quadrupole region may advantageously reduce a magnetic far field generated by current flowing through the circuit segment compared to other configurations.

Figure 1:
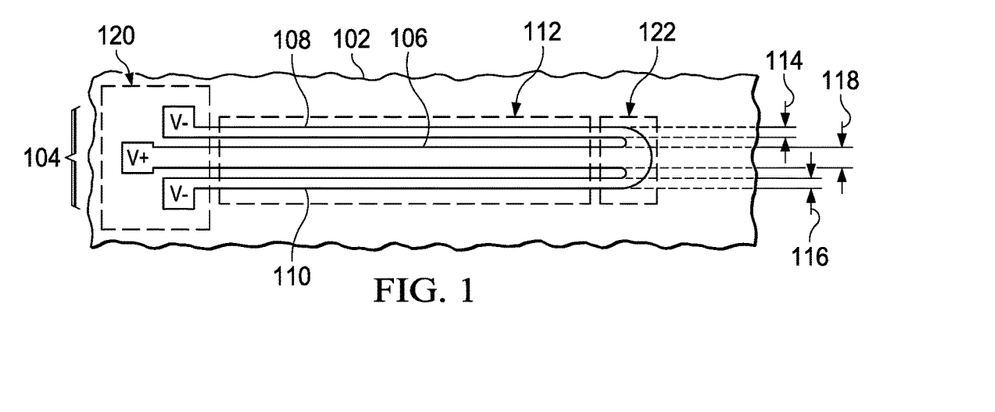
FIG. 1 depicts an example magnetic sensor with a circuit segment having a quadrupole region.

FIG. 1 depicts an example magnetic sensor with a circuit segment having a quadrupole region. The magnetic sensor 100 includes a substrate 102 which may include one or more layers of sapphire, glass, ceramic and organic polymer. The substrate 102 may include a silicon base with a layer of silicon dioxide. A circuit segment 104 is disposed in a conductor layer over the substrate 102. The circuit segment 104 may be a heater element used to maintain an alkali metal vapor at a desired temperature in a cell of the magnetic sensor 100. The circuit segment 104 may be a heater element used to maintain a laser of the magnetic sensor 100 at a desired temperature to tune a wavelength of light from the laser. The conductor layer may include one or more sub-layers of metal, for example an adhesion metal sub-layer, a main metal sub-layer and a cap metal sub-layer. In the instant example, the circuit segment 104 has a linear configuration. The circuit segment 104 includes a supply line 106, a first return line 108 adjacent to the supply line 106 on a first side of the supply line 106, and a second return line 110 adjacent to the supply line 106 on a second side of the supply line 106, opposite from the first return line 108. The supply line 106, the first return line 108 and the second return line 110 run through a quadrupole region 112 of the circuit segment 104. A space between the supply line 106 and the first return line 108 in the quadrupole region 112 is free of metal of the conductor layer. Similarly, a space between the supply line 106 and the second return line 110 in the quadrupole region 112 is free of metal of the conductor layer. A width 114 of the first return line 108 may be substantially equal to a width 116 of the second return line 110 in the quadrupole region 112. A width 118 of the supply line 106 may be substantially equal to the combined widths 114 and 116 of the first return line 108 and the second return line 110, respectively, in the quadrupole region 112. In one version of the instant example, the space between the supply line 106 and the first return line 108 in the quadrupole region 112 is substantially equal to the space between the supply line 106 and the second return line 110 in the quadrupole region 112. Electrical connections may be made to the circuit segment 104 at a connection end 120. The electrical connections may include wire bonds or other electrical connections. The supply line 106, the first return line 108 and the second return line 110 are depicted in FIG. 1 with bond pads in the connection end 120. Other electrical connection elements in the connection end 120 are within the scope of the instant example. The supply line 106, the first return line 108 and the second return line 110 are electrically connected to each other at a terminus 122 at an opposite end of the circuit segment 104 from the connection end 120. The supply line 106, the first return line 108 and the second return line 110 may be electrically connected to each other in the conductor layer, as depicted in FIG. 1. Other electrical connections between the supply line 106, the first return line 108 and the second return line 110 at the terminus 122 are within the scope of the instant example.

During operation of the magnetic sensor 100, electrical current flows into the supply line 106 at the connection end 120 as designated in FIG. 1 by the reference "V+," and flows out of the first return line 108 and the second return line 110 at the connection end 120 as indicated in FIG. 1 by the references "V−." In an alternate mode of operation, the current flow may be reversed. Having substantially equal widths 114 and 116 of the first return line 108 and the second return line 110 may balance magnetic fields around the first return line 108 and the second return line 110 in the quadrupole region 112, and so advantageously reduce a magnetic far field produced by the circuit segment 104. Having the width 118 of the supply line 106 substantially equal to the combined widths 114 and 116 of the first return line 108 and the second return line 110, respectively, in the quadrupole region 112 may provide a substantially equal current density in the supply line 106, the first return line 108 and the second return line 110, and so advantageously provide a desired balance between reliability and cost for the magnetic sensor 100. Reducing the width 118 of the supply line 106 may reduce a size of the circuit segment 104 and possibly reduce a fabrication cost of the magnetic sensor 100. Increasing the width 118 of the supply line 106 may further improve the reliability against electromigration-related effects. Boundaries of the circuit segment 104 at the terminus 122 may be rounded as depicted in FIG. 1 to reduce current crowding and so further improve the reliability of the magnetic sensor 100.

Figure 2:
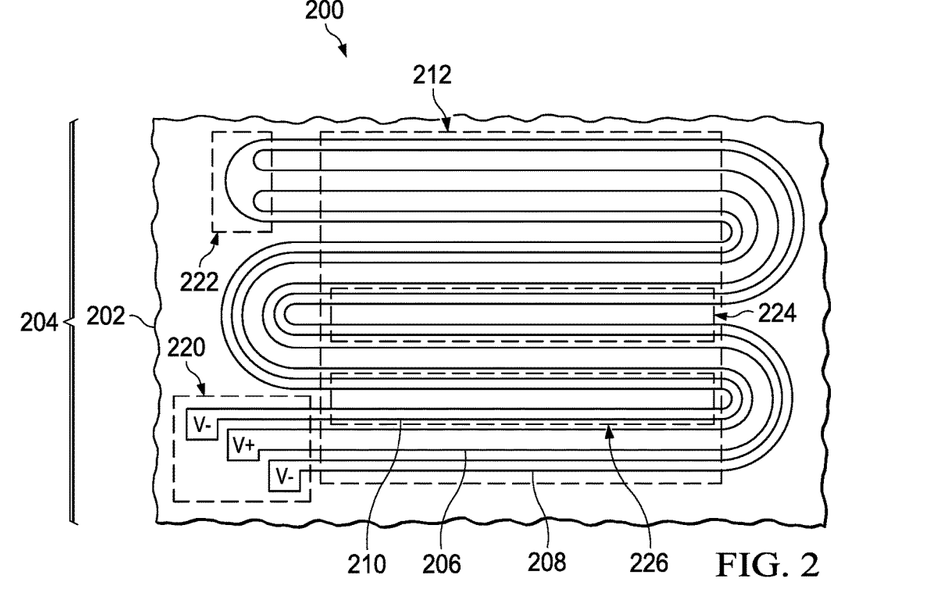
FIG. 2 depicts another example magnetic sensor with a circuit segment having a quadrupole region.

FIG. 2 depicts another example magnetic sensor with a circuit segment having a quadrupole region. The magnetic sensor 200 includes a substrate 202 which may be a structural element of the magnetic sensor 200, for example a support element for a laser or a top plate or bottom plate of an alkali metal vapor cell. A circuit segment 204 is disposed in a conductor layer, which may include one or more sub-layers, over the substrate 202. The circuit segment 204 includes a supply line 206, a first return line 208 adjacent to the supply line 206, and a second return line 210 adjacent to the supply line 206 opposite from the first return line 208. The supply line 206, the first return line 208 and the second return line 210 run through a quadrupole region 212 of the circuit segment 204. In the quadrupole region 212, spaces between the supply line 206 and the first return line 208, and between the supply line 206 and the second return line 210 are free of metal of the conductor layer. In one version of the instant example, the space between the supply line 206 and the first return line 208 in the quadrupole region 212 is substantially equal to the space between the supply line 206 and the second return line 210 in the quadrupole region 212.

In the instant example, the circuit segment 204 has a serpentine configuration, as depicted in FIG. 2 and which may be described as the circuit segment 204 having one or more turns so that two or more portions of the circuit segment 204 are immediately adjacent to each other. A space between the adjacent portions of the circuit segment 204 are free of the conductor layer.

Electrical connections may be made to the circuit segment 204 at a connection end 220. The supply line 206, the first return line 208 and the second return line 210 are electrically connected to each other at a terminus 222 at an opposite end of the circuit segment 204 from the connection end 220.

During operation of the magnetic sensor 200, electrical current flows into the supply line 206 at the connection end 220 as described in reference to FIG. 1. The configuration of the quadrupole region 212 reduces a magnetic far field generated by the current, as described in reference to FIG. 1. Current flowing through two immediately adjacent portions 224 of the first return line 208 in the serpentine configuration are flowing in opposite directions, cancelling the magnetic field between the adjacent portions, which may advantageously further reduce the magnetic far field. Current flowing through two immediately adjacent portions 226 of the second return line 210 in the serpentine configuration are also flowing in opposite directions, accruing a similar advantage. Boundaries of the circuit segment 204 at the terminus 222 may be rounded as depicted in FIG. 2 to reduce current crowding and so further improve the reliability of the magnetic sensor 200. Spaces between the supply line 206 and the first return line 208, and between the supply line 206 and the second return line 210, may be larger in the portion of the circuit segment 204 at the terminus 222 compared to the other portions of the circuit segment 204, to further improve the reliability against electromigration-related effects.

Figure 3:
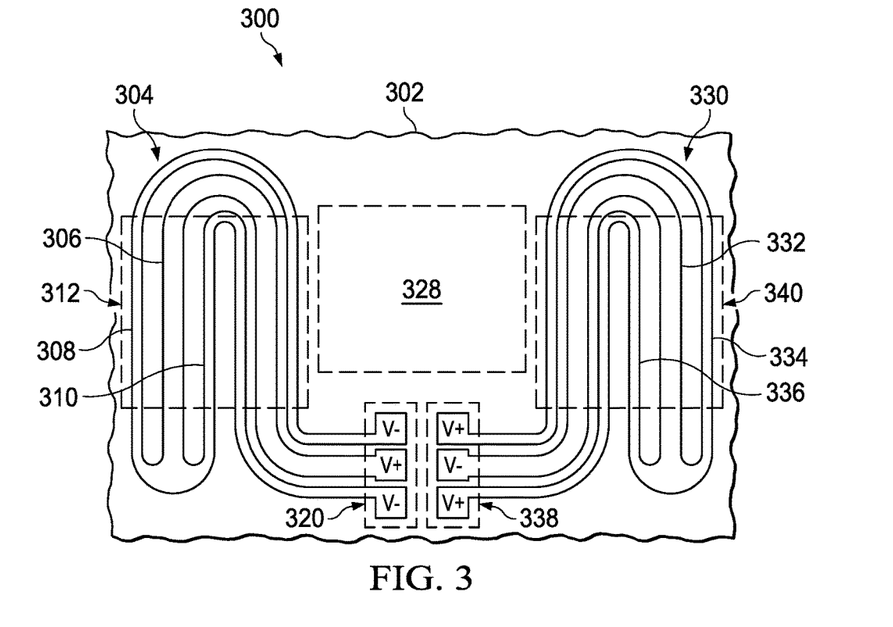
FIG. 3 depicts a further example magnetic sensor with a plurality of circuit segments having quadrupole regions.

FIG. 3 depicts a further example magnetic sensor with a plurality of circuit segments having quadrupole regions. The magnetic sensor 300 includes a substrate 302 which may include an area 328 to be heated. A first circuit segment 304 and a second circuit segment 330 are disposed in a conductor layer over the substrate 302. The first circuit segment 304 includes a first supply line 306, a first return line 308, and a second return line 310; the first supply line 306, the first return line 308 and the second return line 310 run through a first quadrupole region 312 of the first circuit segment 304, as described in reference to FIG. 2.

The second circuit segment 330 includes a second supply line 332, a third return line 334, and a fourth return line 336, similar to the first circuit segment 304. The second supply line 332, the third return line 334 and the fourth return line 336 run through a second quadrupole region 340 of the second circuit segment 330, similarly to the first circuit segment 304. In the instant example, the first circuit segment 304 and the second circuit segment 330 have serpentine configurations, as depicted in FIG. 3, adjacent to the area 328 to be heated.

In the instant example, a portion of the first return line 308 in the first quadrupole region 312 is located immediately adjacent to the area 328 to be heated, and a portion of the third return line 334 in the second quadrupole region 340 is located immediately adjacent to the area 328, on an opposite side of the area 328 from the portion of the first return line 308. The portion of the first return line 308 is parallel to the portion of the third return line 334, and a space between the portion of the first return line 308 and the portion of the third return line 334 is free of the first circuit segment 304 and the second circuit segment 330. Electrical connections may be made to the first circuit segment 304 at a first connection end 320, and to the second circuit segment 330 at a second connection end 338. The first connection end 320 and the second connection end 338 may be configured so that during operation of the magnetic sensor 300, a current direction through the first circuit segment 304 is opposite from a current direction through the second circuit segment 330. For example, the first connection end 320 and the second connection end 338 may be configured so that during operation of the magnetic sensor 300, current flows into the first supply line 306 and out of the second supply line 332. Further, the first connection end 320 and the second connection end 338 may be configured so that during operation of the magnetic sensor 300, current through the first circuit segment 304 and the second circuit segment 330 are substantially equal.

During operation of the magnetic sensor 300, electrical current may flow into the first supply line 306 at the first connection end 320, and out of the second supply line 332 at the second connection end 338. The effect of such a configuration is that current flowing through the first return line 308 adjacent to the area 328 is flowing in an opposite direction from current flowing through the third return line 334 adjacent to the area 328. The serpentine configurations of the first quadrupole region 312 and the second quadrupole region 340 may reduce a magnetic far field generated by the current, as described in reference to FIG. 2. Current flowing in opposite directions through the first return line 308 and the third return line 334 on opposite sides of the area 328 partially cancels the magnetic field in the area 328, which may advantageously further reduce the magnetic far field. This effect may be enhanced by having substantially equal currents through the first circuit segment 304 and the second circuit segment 330.

Figure 4A:
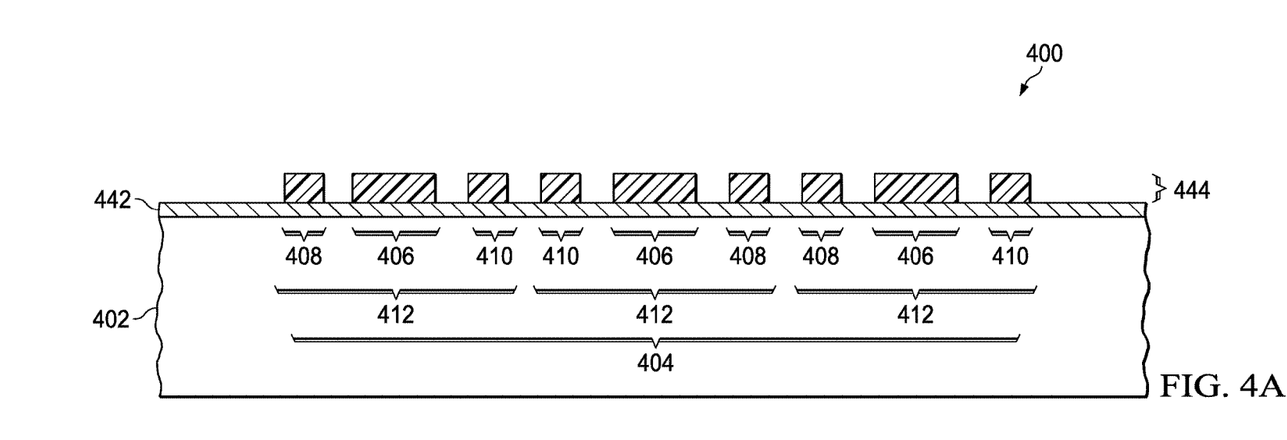
FIG. 4A through FIG. 4D depict an example method of forming a magnetic sensor.

FIG. 4A through FIG. 4D depict an example method of forming a magnetic sensor. Referring to FIG. 4A, the magnetic sensor 400 includes a substrate 402 which may include for example, glass, sapphire, ceramic or silicon. The substrate 402 may be a circular wafer with areas for a plurality of substrates, each substrate being for a separate magnetic sensor. A conductor layer 442 is formed over the substrate 402. The conductor layer 442 may include sub-layers, for example an adhesion sub-layer including titanium, a main sub-layer including aluminum or copper, and possibly a cap layer including titanium nitride. Alternatively, the conductor layer 442 may be a homogeneous layer of metal such as silicon-chromium or nickel-chromium. The conductor layer 442 may be formed by, for example, a sputter process, a reactive sputter process, a metal organic chemical vapor deposition (MOCVD) process, and/or an evaporation process.

An etch mask 444 is formed over the conductor layer 442 which covers areas for a circuit segment 404 of the magnetic sensor 400, including areas for a supply line 406, areas for a first return line 408 and areas for a second return line 410. The areas for the circuit segment 404 have a quadrupole region 412, through which the areas for the supply line 406, areas for the first return line 408 and areas for the second return line 410 pass, for example as described in the examples disclosed herein. In the instant example, the areas for the circuit segment 404 may have a serpentine configuration, so that pairs of the areas for the first return line 408 are adjacent to each other, and that pairs of the areas for the second return line 410 are adjacent to each other, as depicted in FIG. 4A. The etch mask 444 may include photoresist formed by a photolithographic process, and may possibly include an anti-reflection layer. Alternatively, the etch mask 444 may include hard mask material such as silicon dioxide, silicon nitride and/or amorphous carbon.

Figure 4B:
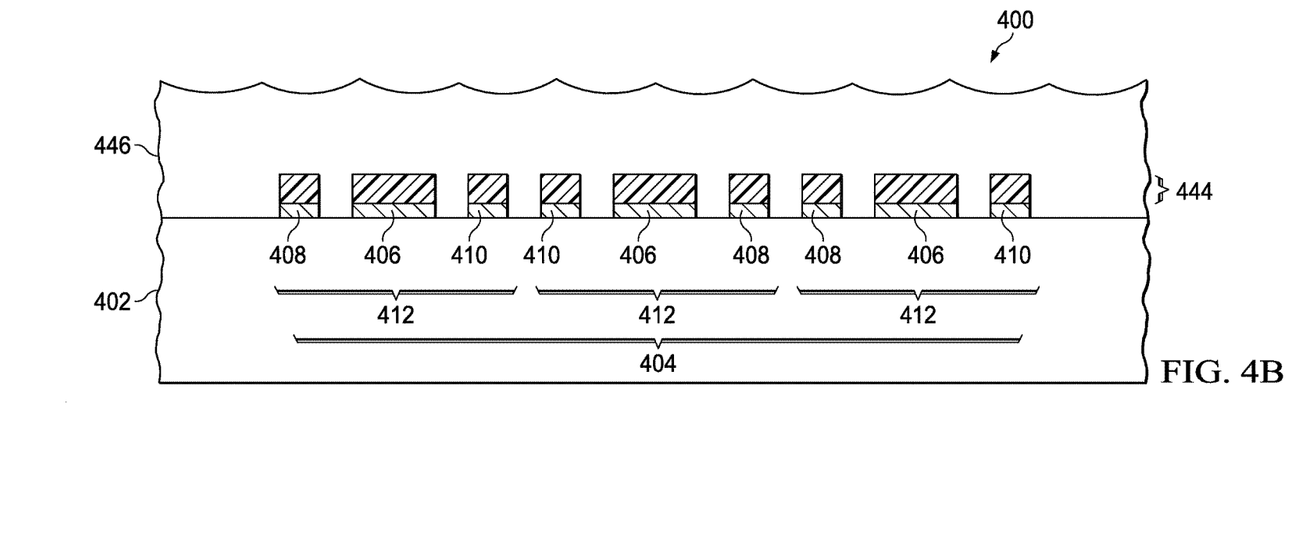

Referring to FIG. 4B, the conductor layer 442 of FIG. 4A is removed where exposed by the etch mask 444 by an etch process 446 to form the circuit segment 404, including the supply line 406, the first return line 408 and the second return line 410. The etch process 446 may include, for example, a wet etch as depicted in FIG. 4B. Alternatively, the etch process 446 may include a plasma etch process such as a reactive ion etch (RIE) process. The etch process 446 may include one or more etch steps with different etch chemistries to remove sub-layers of the conductor layer 442.

Figure 4C:
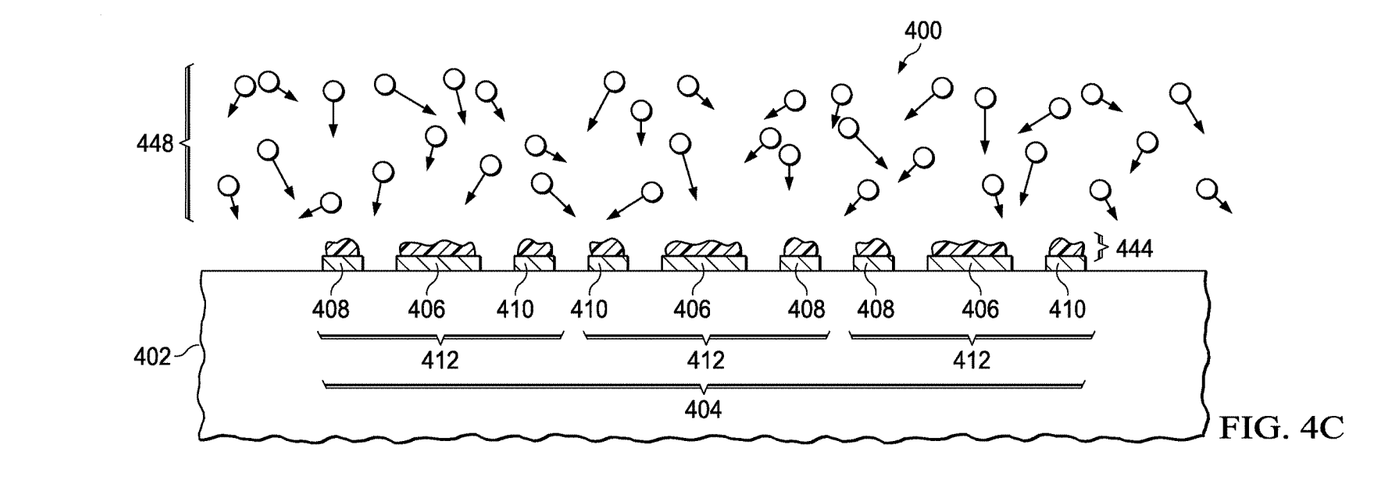

Referring to FIG. 4C, the etch mask 444 is removed, leaving the circuit segment 404 with the quadrupole region 412 in place. Photoresist, other organic material, and amorphous carbon, in the etch mask 444 may be removed by an ash process 448x as depicted in FIG. 4C, followed by a wet solvent process. Inorganic material in a hard mask layer of the etch mask 444 may be removed by a plasma etch process.

Figure 4D:
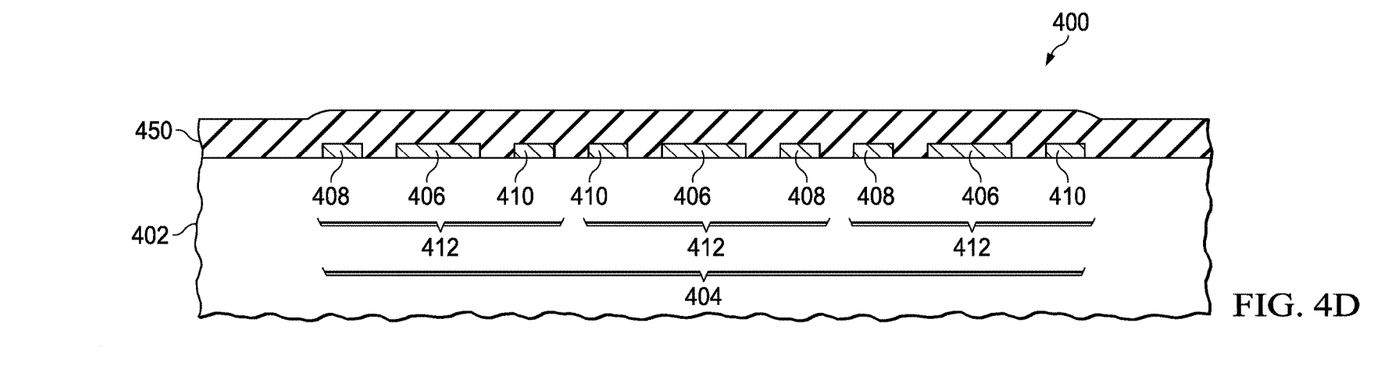

Referring to FIG. 4D, an optional protective layer 450 may be formed over the circuit segment 404. The protective layer 450 may include, for example, silicon dioxide formed by a plasma enhanced chemical vapor deposition (PECVD) process using tetraethyl orthosilicate (TEOS). Alternatively, the protective layer 450 may include a silicon dioxide-based dielectric material formed by a spin-coat process using methyl-silsesquioxane (MSQ), followed by a bake process. The protective layer 450 may be patterned, for example to reduce interference with an optical signal path of the magnetic sensor 400. After forming the circuit segment 404 on the substrate 402, the substrate 402 may be singulated, for example by sawing or scribing, to provide a plurality of substrates with circuit segments for a plurality of magnetic sensors.

Figure 5A:
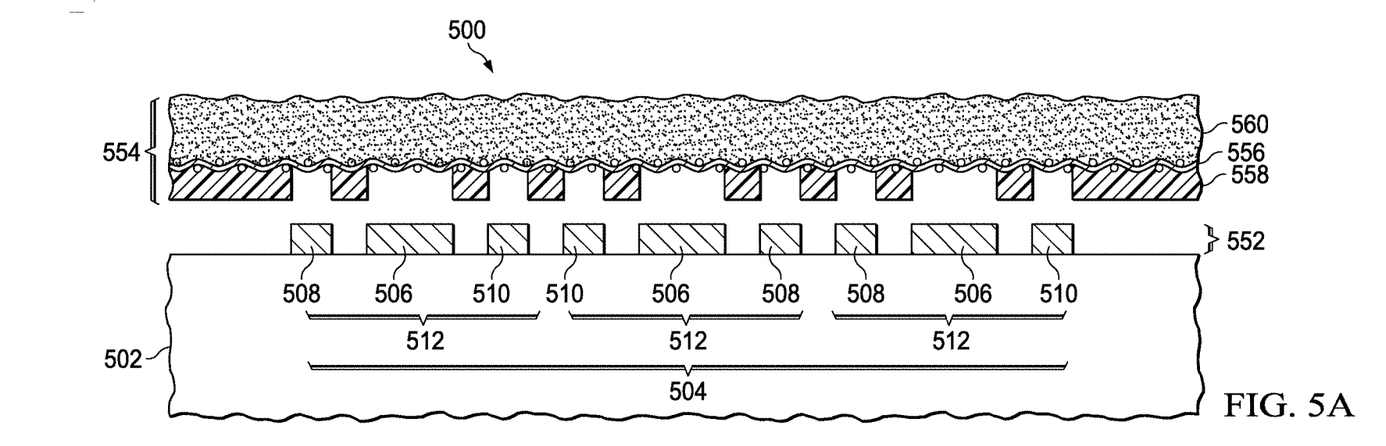
FIG. 5A through FIG. 5D depict another example method of forming a magnetic sensor.

FIG. 5A through FIG. 5D depict another example method of forming a magnetic sensor. Referring to FIG. 5A, the magnetic sensor 500 includes a substrate 502 for example as described in reference to FIG. 4A. A thick film paste pattern 552 of a circuit segment 504, including a supply line 506, a first return line 508 and a second return line 510, is formed on the substrate 502 by a screen print process 554. The thick film paste pattern 552 has a quadrupole region 512, through which the areas for the supply line 506, areas for the first return line 508 and the areas for the second return line 510 pass, for example as described in the examples disclosed herein. In the instant example, the circuit segment 504 may have a serpentine configuration, so that pairs of the first return line 508 are adjacent to each other, and that pairs of the second return line 510 are adjacent to each other, as depicted in FIG. 5A. The screen print process 554 uses a stencil comprising a screen 556 with an emulsion 558 having openings with a pattern for the circuit segment 504. Thick film paste 560 is pushed through the screen 556 by a squeegee or wiper in the openings in the emulsion 558 to form the thick film paste pattern 552 on the substrate 502. The thick film paste 560 may include, for example, conductive particles in an organic binder mixed with volatile solvent.

Figure 5B:
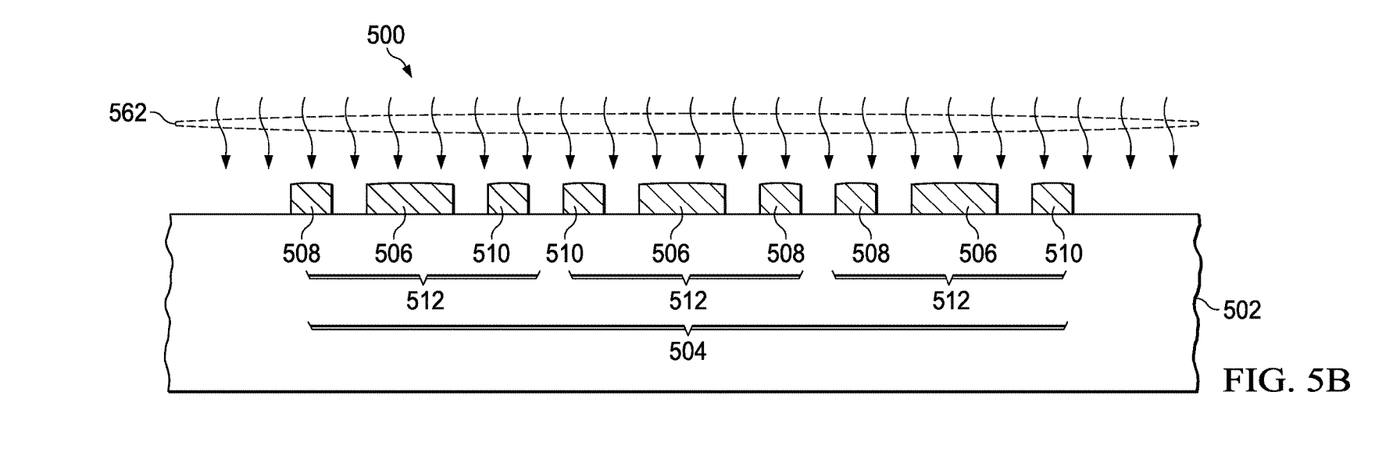

Referring to FIG. 5B, the thick film paste pattern 552 of FIG. 5A is heated by a firing process 562 to remove volatile materials and thus to form a conductor layer, and leaving the circuit segment 504 with the quadrupole region 512, including the supply line 506, the first return line 508 and the second return line 510, in the conductor layer on the substrate 502. The firing process 562 may include a ramped furnace operation culminating in a peak heating step at approximately 850° C. for approximately 10 minutes. Alternatively, the firing process 562 may include an infrared heating operation, for example in a chain furnace.

Figure 5C:
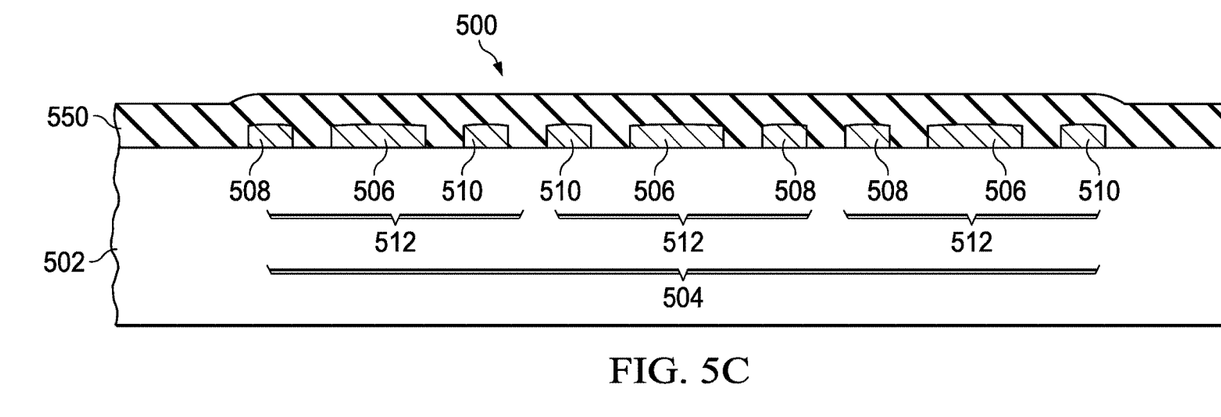

Referring to FIG. 5C, an optional protective layer 550 may be formed over the circuit segment 504. The protective layer 550 may be formed by another thick film screen print process with dielectric paste.

Figure 5D:
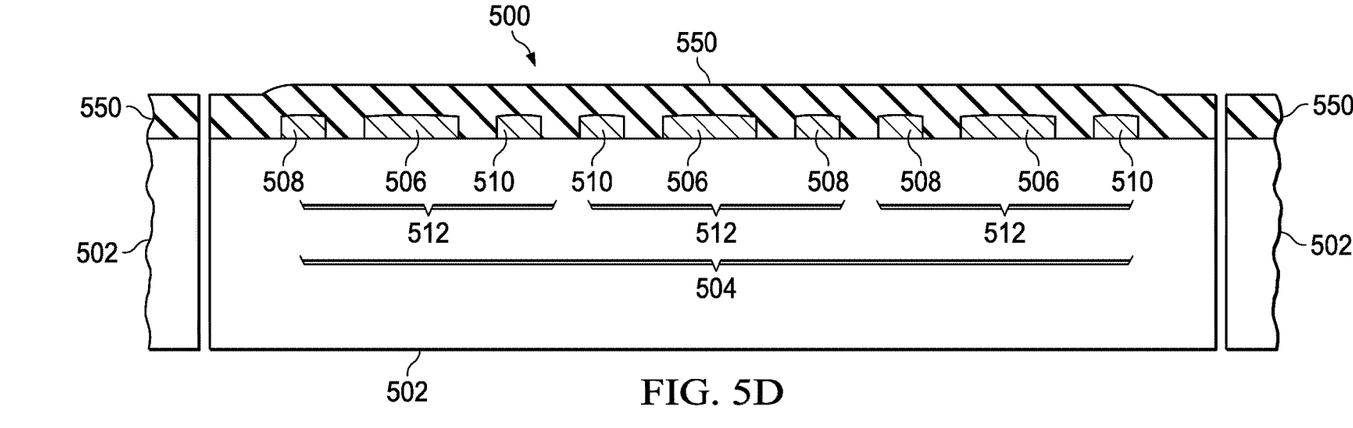

Referring to FIG. 5D, the substrate 502 is singulated, for example by scribing or sawing. The substrate 502 may be singlated to separate a portion of the substrate 502 for the magnetic sensor 500 from other portions of the substrate 502 for other magnetic sensors. Alternatively, the substrate 502 may be singlated to remove excess, unwanted portions of the substrate 502 from a portion of the substrate 502 containing the circuit segment 504.

Figure 6A:
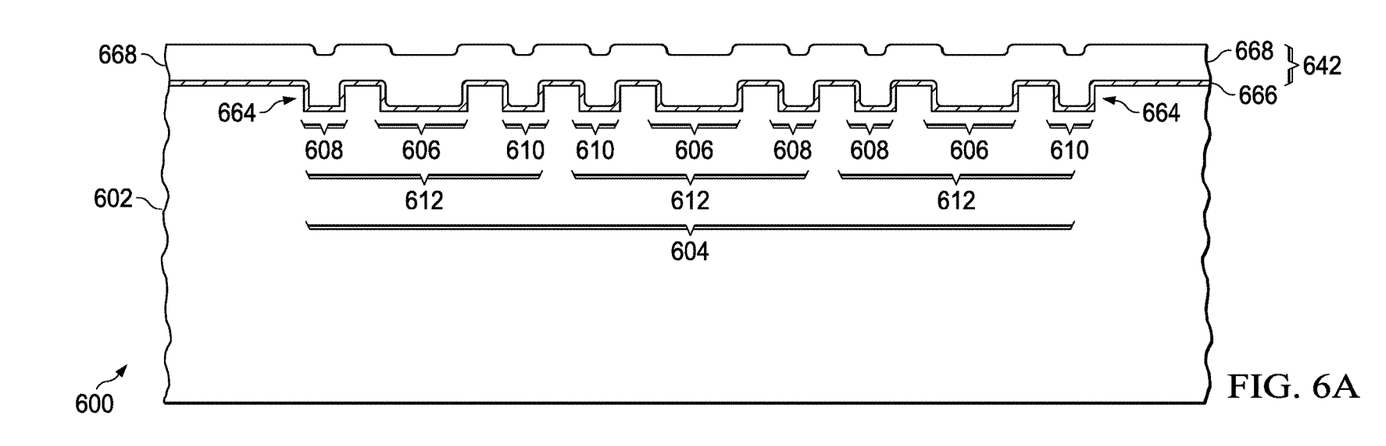
FIG. 6A and FIG. 6B depict a further example method of forming a magnetic sensor.
Figure 6B:
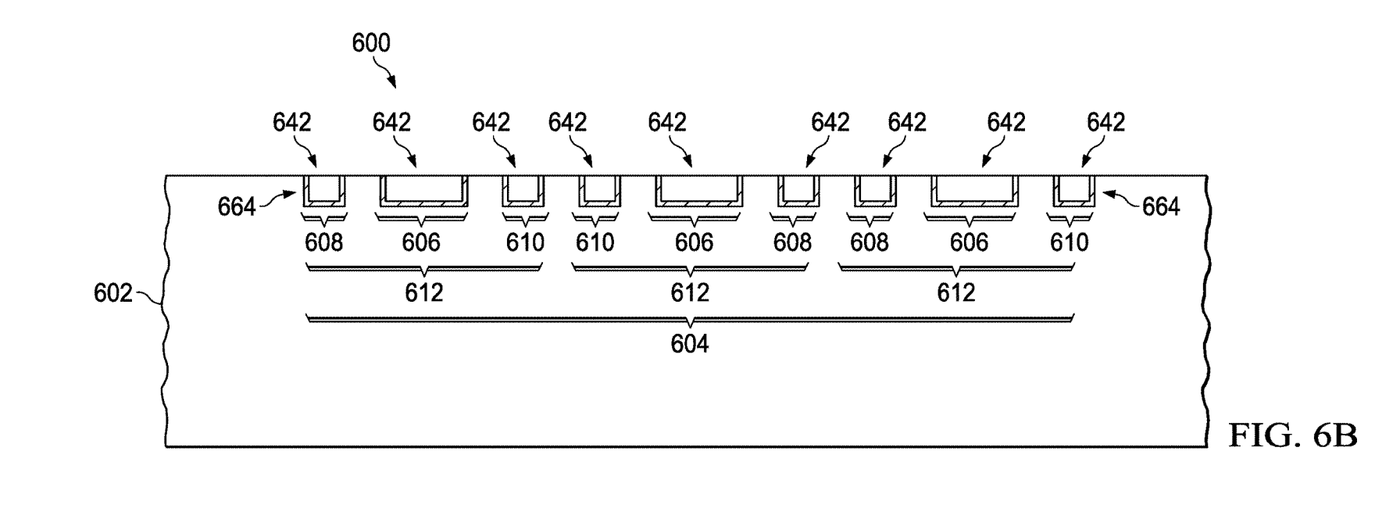

FIG. 6A and FIG. 6B depict a further example method of forming a magnetic sensor. Referring to FIG. 6A, the magnetic sensor 600 includes a substrate 602 for example as described in reference to FIG. 4A. Trenches 664 for a circuit segment 604, including a supply line 606, a first return line 608 and a second return line 610, are formed in the substrate 602, for example by a timed etch process using an etch mask of photoresist. The trenches 664 have a quadrupole region 612, through which the areas for the supply line 606, areas for the first return line 608 and areas for the second return line 610 pass, for example as described in the examples disclosed herein. A layer of metal 640 is formed over the substrate 602 and in the trenches 664. The layer of metal 640 may include, for example, an adhesion/barrier layer 666 of titanium, tantalum, titanium nitride and/or tantalum nitride, contacting the substrate 602, formed by sputtering, reactive sputtering and/or atomic layer deposition (ALD). The layer of metal 640 may further include a fill layer 668, for example of copper or tungsten, formed on the adhesion/barrier layer 666. Copper in the fill layer 668 may be formed by an electroplating process. Tungsten in the fill layer 668 may be formed by an MOCVD process.

Referring to FIG. 6B, the layer of metal 640 over the substrate 602 is removed, leaving the layer of metal 640 in the trenches 664 to form the circuit segment 604, including the supply line 606, the first return line 608 and the second return line 610. The layer of metal 640 over the substrate 602 may be removed, for example, by an etchback process and/or a chemical mechanical polish (CMP) process. In the instant example, the circuit segment 604 does not extend above the substrate 602, which may provide an advantage during assembly of the substrate 602 into the magnetic sensor 600. For example, the substrate 602 may be a top plate or a bottom plate of an alkali metal vapor cavity, and may be assembled to other structural members of the alkali metal vapor cavity by compressive force, in which case the compressive force may be applied across the substrate 602 without damaging the circuit segment 604.

Figure 7:
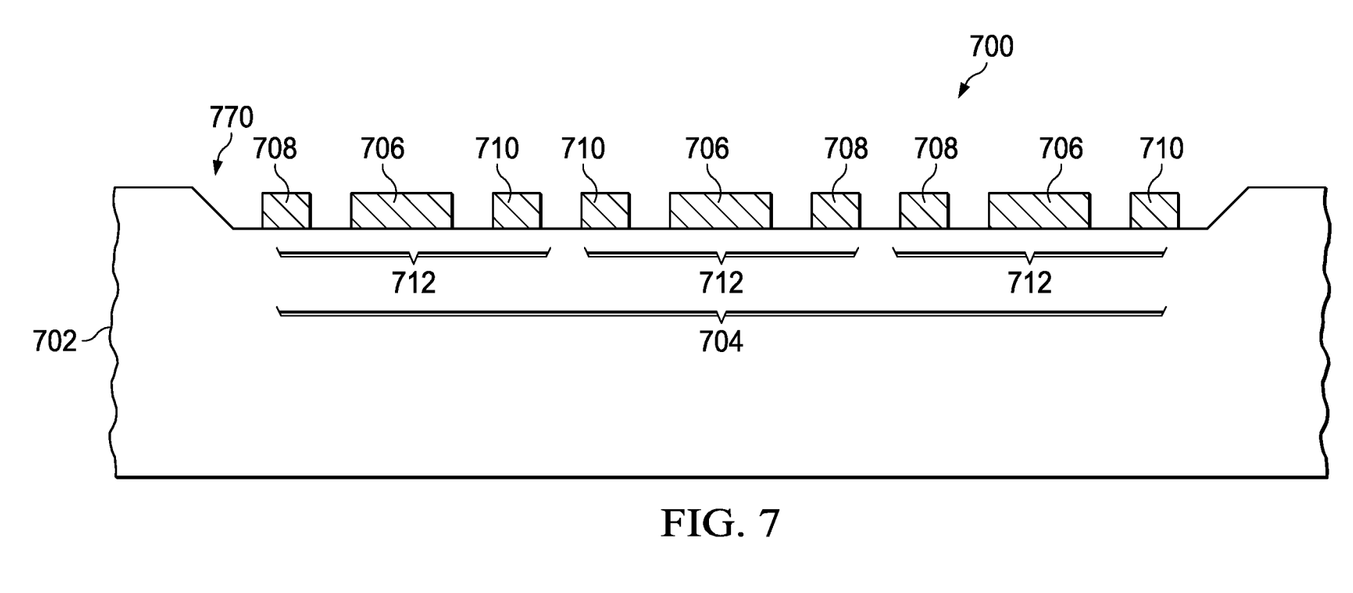
FIG. 7 is a cross section of an alternate example of a substrate of a magnetic sensor with a circuit segment having a quadrupole region.

FIG. 7 is a cross section of an alternate example of a substrate of a magnetic sensor with a circuit segment having a quadrupole region. The substrate 702 of the magnetic sensor 700 has a recess 770 at a surface for the circuit segment 704. The circuit segment 704, including a supply line 706, a first return line 708 and a second return line 710, is formed in a conductor layer in the recess 770. The supply line 706, the first return line 708 and the second return line 710 run through a quadrupole region 712 of the circuit segment 704. The circuit segment 704 may be formed, for example, in accordance with any of the examples disclosed herein. The circuit segment 704 does not extend out of the recess 770, and so the substrate 702 may accrue the advantage in assembly of the magnetic sensor 700 discussed in reference to FIG. 6B.

Figure 8:
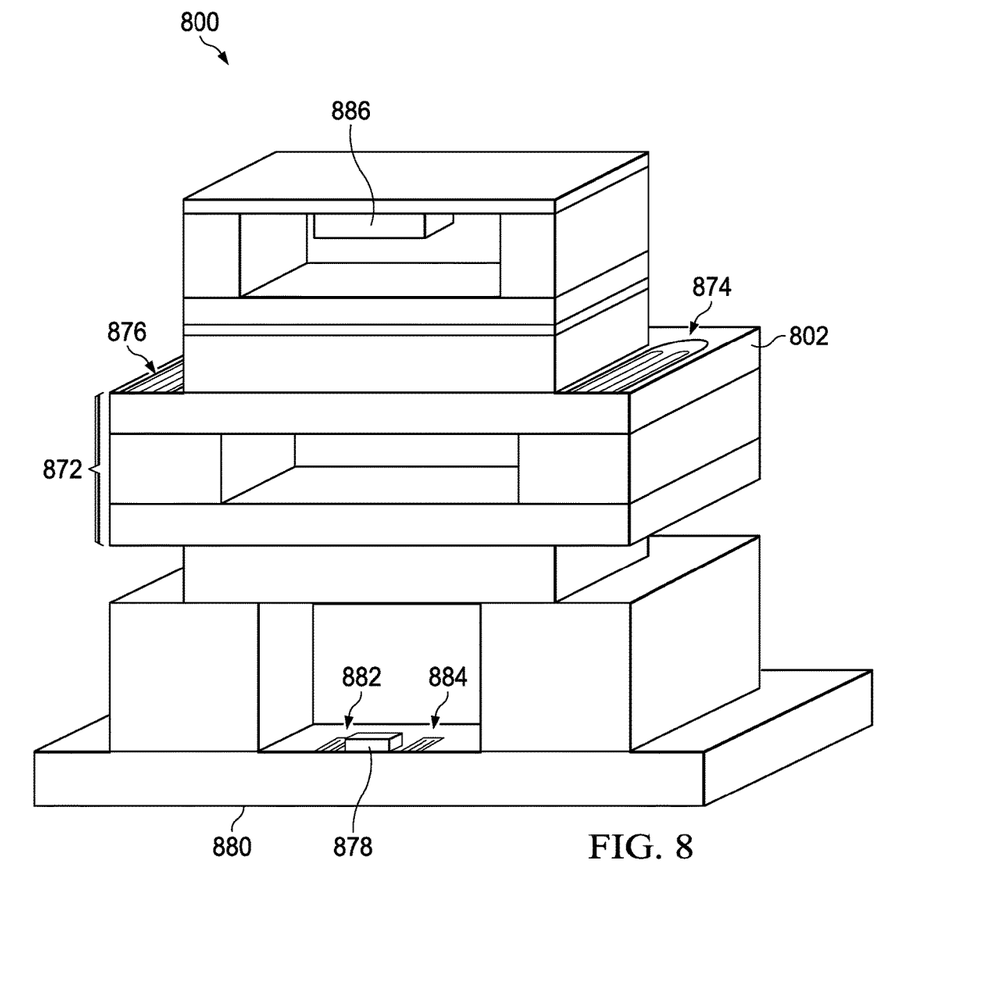
FIG. 8 depicts an example magnetic sensor containing circuit segments with quadrupole regions.

FIG. 8 depicts an example magnetic sensor containing circuit segments with quadrupole regions. In the instant example, the magnetic sensor 800 includes an alkali metal vapor cavity 872. A first cavity heater circuit segment 874 and a second cavity heater circuit segment 876, each with quadrupole regions as described in reference to the examples disclosed herein, are disposed on a plate 802 of the alkali metal vapor cavity 872. The first cavity heater circuit segment 874 and the second cavity heater circuit segment 876 may be electrically coupled in parallel or in series. The magnetic sensor 800 also includes a vertical cavity surface emitting laser (VCSEL) 878 disposed on a support substrate 880 below the alkali metal vapor cavity 872. A first laser heater circuit segment 882 and a second laser heater circuit segment 884, each with quadrupole regions, are disposed on the support substrate 880 adjacent to the VCSEL 878. The first laser heater circuit segment 882 and the second laser heater circuit segment 884 may be electrically coupled in parallel or in series. In another version of the instant example, the magnetic sensor 800 may have only one laser heater circuit segment, disposed below or adjacent to the VCSEL 878. The magnetic sensor 800 further includes an optical sensor 886 disposed above the alkali metal vapor cavity 872, opposite from the VCSEL 878.

During operation of the magnetic sensor 800, current flows through the first cavity heater circuit segment 874 and the second cavity heater circuit segment 876 to heat the alkali metal vapor cavity 872 to a desired temperature range. Having the quadrupole regions in the first cavity heater circuit segment 874 and the second cavity heater circuit segment 876 may advantageously reduce a magnetic far field of the first cavity heater circuit segment 874 and the second cavity heater circuit segment 876 in an optical signal path in the alkali metal vapor cavity 872 compared to other circuit segment patterns. Also during operation of the magnetic sensor 800, current flows through the first laser heater circuit segment 882 and the second laser heater circuit segment 884 to maintain the VSCEL 878 in a desired temperature range so as to provide an output wavelength of the VSCEL 878 in a desired wavelength range. Having the quadrupole regions in the first laser heater circuit segment 882 and the second laser heater circuit segment 884 may also advantageously reduce a magnetic far field of the first laser heater circuit segment 882 and the second laser heater circuit segment 884 in an optical signal path in the alkali metal vapor cavity 872 compared to other circuit segment patterns.

Figure 9:
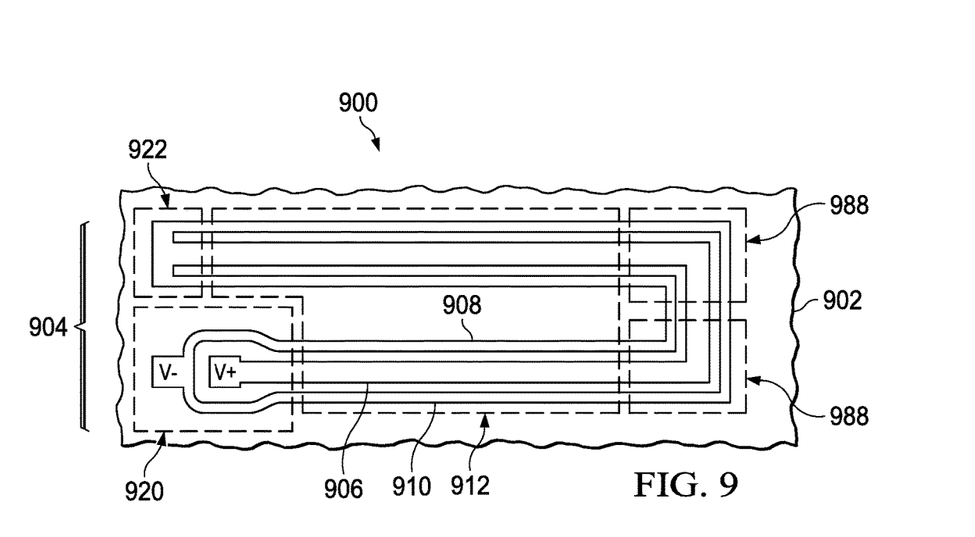
FIG. 9 through FIG. 11 depict alternative configurations for circuit segments having quadrupole regions.
Figure 10:
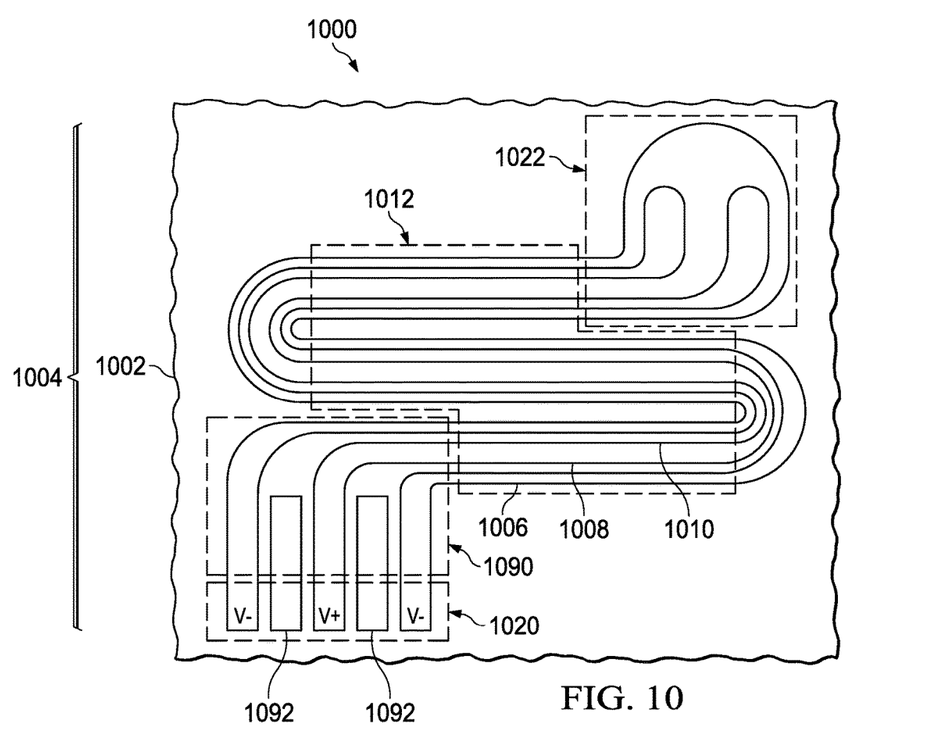
Figure 11:
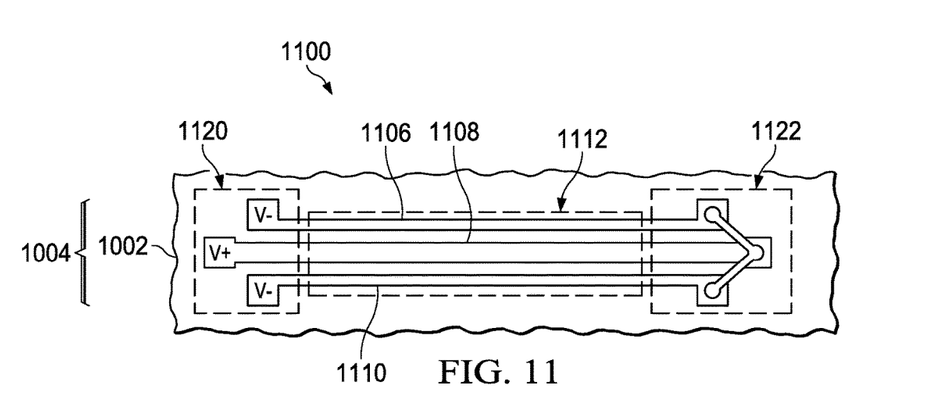

FIG. 9 through FIG. 11 depict alternative configurations for circuit segments having quadrupole regions. Referring to FIG. 9, a circuit segment 904 having a quadrupole region 912 is disposed on a substrate 902. The circuit segment 904 includes a supply line 906, a first return line 908 and a second return line 910, which are electrically coupled together at a terminus 922. In the instant example, the terminus 922 has a rectangular pattern, which may advantageously enable greater lengths of the supply line 906, the first return line 908 and the second return line 910 in a given area for the circuit segment 904. In the instant example, turns 988 of the circuit segment 904 may also have rectangular patterns, accruing a similar advantage. In the instant example, the first return line 908 is electrically connected to the second return line 910 in the conductor layer at a connection end 920, which may advantageously simplify forming connections to the circuit segment 904.

Referring to FIG. 10, a circuit segment 1004 having a quadrupole region 1012 is disposed on a substrate 1002. The circuit segment 1004 includes a supply line 1006, a first return line 1008 and a second return line 1010 in a conductor layer, which are electrically coupled together in the conductor layer at a terminus 1022. The supply line 1006, the first return line 1008 and the second return line 1010 run through the quadrupole region 1012 of the circuit segment 1004, as described in any of the example disclosed herein. In the instant example, the terminus 1022 has an enlarged pattern, in which a space between the first return line 1008 and the supply line 1006 proximate to the terminus 1022 is larger than a space between the first return line 1008 and the supply line 1006 proximate to a connection end 1020 of the circuit segment 1004. The enlarged pattern of the terminus 1022 may advantageously provide greater reliability against electromigration-related effects.

The circuit segment 1004 includes a connection end 1020 with structures, such as bond pads, for making electrical connections to the supply line 1006, the first return line 1008 and the second return line 1010. The circuit segment 1004 may possibly include an optional transition region 1090 between the connection end 1020 and the quadrupole region 1012 of the circuit segment 1004, in which widths of the supply line 1006, the first return line 1008 and the second return line 1010 vary from their values in the quadruple layout. Conductor structures 1092 which are in the same conductor layer as the circuit segment 1004 may possibly be disposed between the supply line 1006, the first return line 1008 and the second return line 1010, possibly to provide electrical shielding, in the connection end 1020 and possibly into the transition region 1090. The conductor structures 1092 do not extend into the quadrupole region 1012 of the circuit segment 1004.

Referring to FIG. 11, a circuit segment 1104 having a quadrupole region 1112 is disposed on a substrate 1102. The circuit segment 1104 includes a supply line 1106, a first return line 1108 and a second return line 1110 in a conductor layer, which are electrically coupled together at a terminus 1122. The supply line 1106, the first return line 1108 and the second return line 1110 run through the quadrupole region 1112 of the circuit segment 1104, as described in any of the examples disclosed herein. Electrical connections may be made to the circuit segment 1104 at a connection end 1120. In the instant example, the first return line 1108 and the second return line 1110 are electrically coupled to the supply line 1106 at the terminus 1122 outside of the conductor layer, for example through wire bonds. The terminus configuration of the instant example may advantageously provide flexibility of connecting multiple circuit segments in a magnetic sensor.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. A magnetic sensor, comprising:
a substrate; and
a circuit segment having a quadrupole region disposed on the substrate, comprising:
a supply line disposed in a conductor layer;
a first return line disposed in the conductor layer adjacent to the supply line, wherein a space between the first return line and the supply line is free of the conductor layer; and
a second return line disposed in the conductor layer adjacent to the supply line opposite from the first return line, wherein a space between the second return line and the supply line is free of the conductor layer;
wherein the first return line and the second return line are electrically coupled to the supply line at a terminus of the circuit segment.

2. The magnetic sensor of claim 1, wherein a width of the first return line is equal to a width of the second return line.

3. The magnetic sensor of claim 1, wherein a width of the supply line is equal to a sum of a width of the first return line and a width of the second return line.

4. The magnetic sensor of claim 1, wherein the substrate is a plate of an alkali metal vapor cell of the magnetic sensor.

5. The magnetic sensor of claim 1, wherein the substrate is a support substrate of a vertical cavity surface emitting laser (VCSEL) of the magnetic sensor.

6. The magnetic sensor of claim 1, wherein the circuit segment has a serpentine configuration, wherein the circuit segment has a turn so that two portions of the circuit segment are immediately adjacent to each other, and a space between the adjacent portions of the circuit segment are free of the conductor layer.

7. The magnetic sensor of claim 6, wherein the circuit segment is a first circuit segment of a plurality of circuit segments, the supply line is a first supply line, and the terminus is a first terminus, the magnetic sensor further comprising a second circuit segment of the plurality of circuit segments, the second circuit segment having a quadrupole region, the second circuit segment being disposed over the substrate, the second circuit segment comprising:
a second supply line disposed in the conductor layer;
a third return line disposed in the conductor layer adjacent to the second supply line, wherein a space between the third return line and the second supply line is free of the conductor layer; and
a fourth return line disposed in the conductor layer adjacent to the second supply line opposite from the third return line, wherein a space between the fourth return line and the second supply line is free of the conductor layer;

wherein the third return line and the fourth return line are electrically coupled to the second supply line at a terminus of the second circuit segment, and the second circuit segment has a serpentine configuration; and wherein a portion of the first return line parallel to a portion of the third return line, and a space between the portion of the first return line and the portion of the third return line is free of the first circuit segment and the second circuit segment.

8. The magnetic sensor of claim 1, wherein the supply line, the first return line and the second return line are recessed below a surface of the substrate.

9. The magnetic sensor of claim 8, wherein the terminus has an enlarged pattern, wherein a space between the first return line and the supply line proximate to the terminus is larger than a space between the first return line and the supply line proximate to a connection end of the circuit segment at an opposite end of the circuit segment from the terminus.

10. The magnetic sensor of claim 1, wherein the first return line and the second return line are electrically coupled to the supply line outside of the conductor layer at the terminus.

11. A method of forming a magnetic sensor, comprising:
providing a substrate;
forming a circuit segment having a quadrupole region in a conductor layer on the substrate, the circuit segment comprising:
  forming a supply line disposed in the conductor layer;
  forming a first return line disposed in the conductor layer adjacent to the supply line, wherein a space between the first return line and the supply line is free of the conductor layer;
  forming a second return line disposed in the conductor layer adjacent to the supply line opposite from the first return line, wherein a space between the second return line and the supply line is free of the conductor layer;
  forming an electrical connection between the supply line and the first return line at a terminus of the circuit segment; and
  forming an electrical connection between the supply line and the second return line at the terminus; and
forming electrical connections to the supply line, the first return line and the second return line at a connection end of the circuit segment opposite from the terminus.

12. The method of claim 11, wherein forming the first return line and forming second return line are performed so that a width of the first return line is equal to a width of the second return line.

13. The method of claim 11, wherein forming the supply line, forming the first return line and forming second return line are performed so that a width of the supply line is equal to a sum of a width of the first return line and a width of the second return line.

14. The method of claim 11, wherein forming the supply line, forming the first return line and forming second return line are performed so that the circuit element has a serpentine configuration, wherein the circuit segment has a turn so that two portions of the circuit segment are immediately adjacent to each other, and a space between the adjacent portions of the circuit segment are free of the conductor layer.

15. The method of claim 11, further comprising singulating the substrate after forming the circuit segment.

16. The method of claim 11, wherein forming the supply line, forming the first return line and forming second return line comprise:
  forming the conductor layer as a continuous conductor layer over the substrate;
  forming an etch mask over the layer of metal which covers areas for the supply line, the first return line and second return line;
  removing the conductor layer where exposed by the etch mask; and
  subsequently removing the etch mask.

17. The method of claim 11, wherein forming the supply line, forming the first return line and forming second return line comprise:
  forming a thick film paste pattern having the quadrupole region over the substrate by a screen print process; and
  heating the thick film paste pattern to form the conductor layer, thereby forming the supply line, the first return line and second return line in the conductor layer.

18. The method of claim 11, wherein the supply line, the first return line and the second return line are recessed below a surface of the substrate, and further comprising assembling the substrate into an alkali metal vapor cell of the magnetic sensor.

19. The method of claim 18, wherein the substrate is composed of transparent material.

20. The method of claim 11, further comprising assembling a VCSEL of the magnetic sensor onto the substrate proximate to the circuit segment.

* * * * *